(12) United States Patent
Kuwabara et al.

(10) Patent No.: US 11,965,730 B2
(45) Date of Patent: Apr. 23, 2024

(54) METHOD FOR MEASURING FILM THICKNESS DISTRIBUTION OF WAFER WITH THIN FILMS

(71) Applicants: SHIN-ETSU HANDOTAI CO., LTD., Tokyo (JP); UNITY SEMICONDUCTOR, Montbonnot-Saint-Martin (FR)

(72) Inventors: Susumu Kuwabara, Annaka (JP); Kevin Quinquinet, Villard Bonnot (FR); Philippe Gastaldo, Pontcharra (FR)

(73) Assignees: SHIN-ETSU HANDOTAI CO., LTD., Tokyo (JP); UNITY SEMICONDUCTOR, Montbonnot-Saint-Martin (FR)

( * ) Notice: Subject to any disclaimer, the term of this patent is extended or adjusted under 35 U.S.C. 154(b) by 232 days.

(21) Appl. No.: 17/762,859

(22) PCT Filed: Sep. 16, 2020

(86) PCT No.: PCT/JP2020/035018
§ 371 (c)(1),
(2) Date: Mar. 23, 2022

(87) PCT Pub. No.: WO2021/065499
PCT Pub. Date: Apr. 8, 2021

(65) Prior Publication Data
US 2022/0341728 A1  Oct. 27, 2022

(30) Foreign Application Priority Data
Oct. 3, 2019 (JP) .................. 2019-182831

(51) Int. Cl.
*G01B 11/06* (2006.01)

(52) U.S. Cl.
CPC ............... *G01B 11/0625* (2013.01)

(58) Field of Classification Search
CPC .................................... G01B 11/0625
(Continued)

(56) References Cited

U.S. PATENT DOCUMENTS

| 5,555,472 A | 9/1996 | Clapis et al. |
| 2013/0063733 A1 | 3/2013 | Kuwabara |

(Continued)

FOREIGN PATENT DOCUMENTS

| JP | H07-260437 A | 10/1995 |
| JP | 2011-249621 A | 12/2011 |

(Continued)

OTHER PUBLICATIONS

Dec. 8, 2020 Search Report issued in International Patent Application No. PCT/JP2020/035018.
(Continued)

*Primary Examiner* — Edmond C Lau
*Assistant Examiner* — Omar H Nixon
(74) *Attorney, Agent, or Firm* — Oliff PLC

(57) ABSTRACT

A method includes: determining height Z1 of a focus by an optical microscope having autofocus function which uses irradiation light of wavelength λ0 to adjust the focus; determining a wavelength λ1 of irradiation light used for obtaining observation image of second thin film; obtaining observation image of second thin film by using irradiation light of the wavelength λ1, while altering heights of the focus with the Z1 as reference point; calculating standard deviation of reflected-light intensity distribution within the observation image, obtaining height Z2 of the focus corresponding to a peak position where standard deviation is greatest, and calculating a difference ΔZ between Z1 and Z2; correcting the autofocus function with ΔZ as a correction (Continued)

value; and using the corrected autofocus function to adjust the focus, obtaining the observation image of the second thin film, and calculating the film thickness distribution from the reflected-light intensity distribution within the observation image.

8 Claims, 5 Drawing Sheets

(58) Field of Classification Search
USPC .......................................................... 356/630
See application file for complete search history.

(56) References Cited

U.S. PATENT DOCUMENTS

2015/0300809 A1   10/2015   Kononchuk et al.
2019/0033054 A1*  1/2019    Vaupel ................... G01B 11/06

FOREIGN PATENT DOCUMENTS

| JP | 2016-504566 A | 2/2016 |
| JP | 2016-114506 A | 6/2016 |
| JP | 2017-125782 A | 7/2017 |
| JP | 2017-198491 A | 11/2017 |
| WO | 2017/122248 A1 | 7/2017 |

OTHER PUBLICATIONS

Apr. 5, 2022 International Preliminary Report on Patentability issued in International Patent Application No. PCT/JP2020/035018.

* cited by examiner

[FIG. 1]

S1 — Obtaining height Z1 of focus by AF with irradiation light of wavelength λ0

S2 — Determining wavelength λ1 of irradiation light for obtaining observation image of second thin film S3 — Obtaining observation image of second thin film, while altering heights of focus with Z1 as reference point (irradiation light wavelength λ1)

S4 — Obtaining height Z2 of focus, and calculating correction value ΔZ (=Z1-Z2)

S5 — Correcting AF function of optical microscope

S6 — Obtaining observation image of second thin film using corrected AF function, and calculating film thickness distribution from reflected-light intensity distribution of observation image

[FIG. 2]
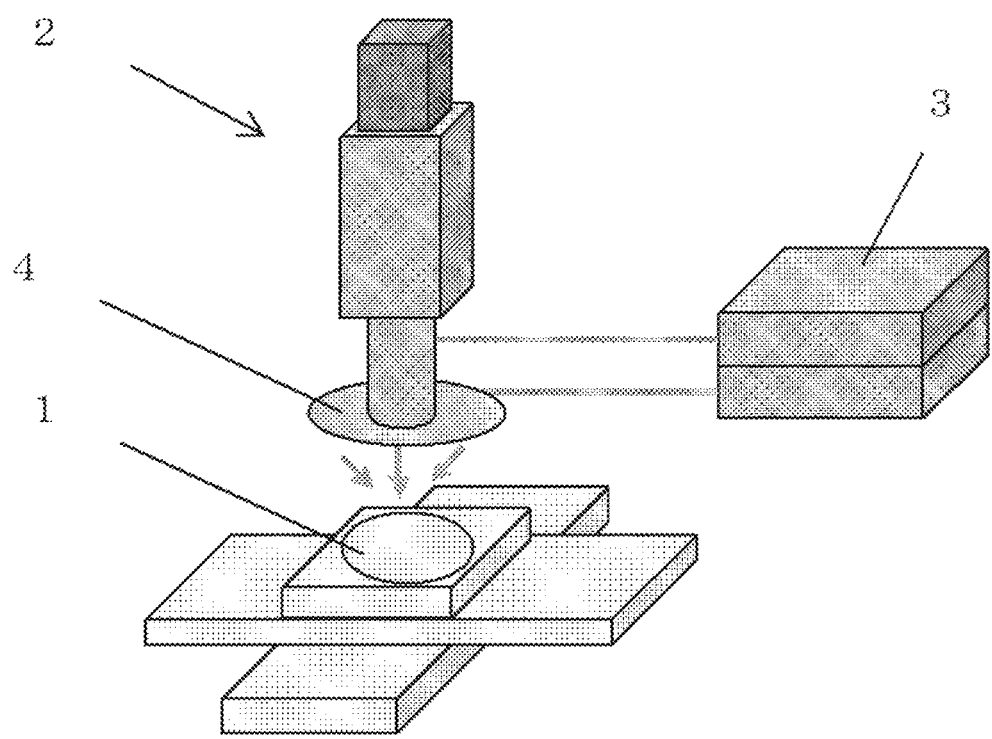

[FIG. 3]
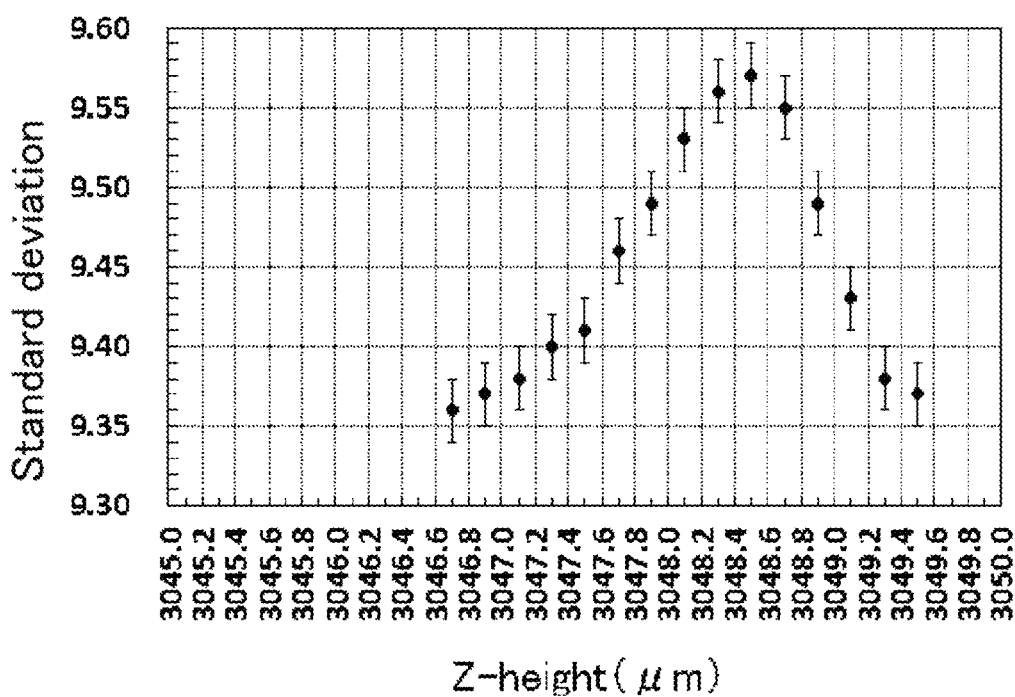

[FIG. 4]
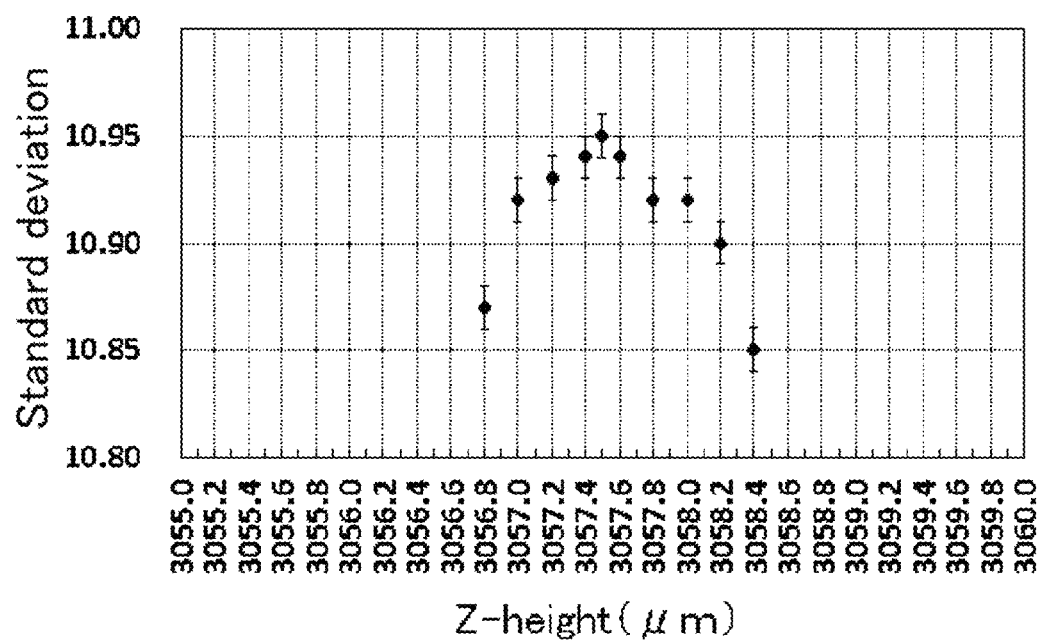

[FIG. 5]
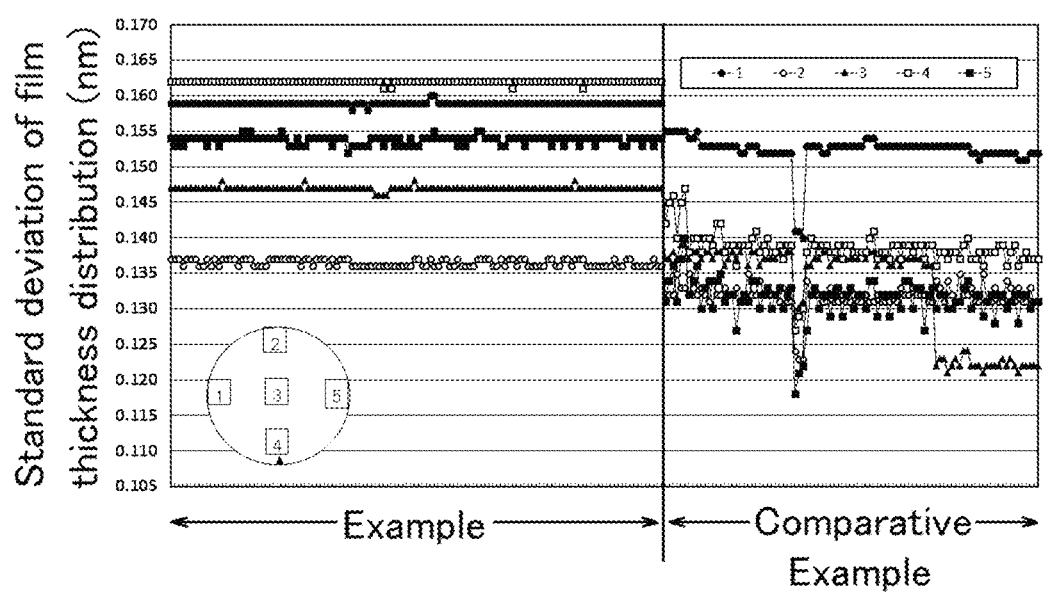

METHOD FOR MEASURING FILM THICKNESS DISTRIBUTION OF WAFER WITH THIN FILMS

TECHNICAL FIELD

The present invention relates to: a method for measuring a film thickness distribution of a wafer with thin films.

BACKGROUND ART

As a wafer with thin films, for example, an SOI wafer which has an oxide film on a substrate as a BOX layer and a single crystal silicon film as an SOI layer is known. Generally, in a manufacturing process of an SOI wafer, the SOI layer film thickness and the BOX layer film thickness of the SOI wafer to be manufactured are set according to the specifications (film thickness specifications) of the user, and after manufacturing the SOI wafer with the set values of the film thicknesses as target values, an in-plane distribution of the SOI layer film thickness is evaluated in an inspection process etc.

In particular, in art FD-SOI device with a design rule of 28 nm or less, a strict film thickness uniformity of the SOI layer is required. Film thickness uniformity of the SOI layer is required in a microscopic area, as well as film thickness uniformity of an entire SOI wafer with a diameter of 300 mm.

Accordingly, needs are arising for not only the evaluation of the SOI film thickness uniformity of the entire wafer, but also the evaluation of SOI layer film thickness uniformity in the microscopic area to improve and guarantee quality. A conventionally performed measuring of film thickness with a measuring spot which has a large measuring area is not sufficient, and evaluation of the film thickness of an SOI layer on a microscopic level in a microscopic area has come to be needed.

The present inventor has proposed a method for evaluating a wafer with then films, in which light that has a single wavelength λ is applied to a partial region of a wafer surface, reflected light from the region is detected, reflected light intensity for each pixel obtained by dividing the region into many pieces is measured, a reflected-light intensity distribution in the region is obtained, and the film thickness distribution of the thin film in the region is calculated from the reflected-light intensity distribution (for example, Patent Documents 1 to 3). In addition, Patent Document 4 also discloses a method for measuring variation in the thickness of a layer in a multilayer semiconductor structure.

CITATION LIST

Patent Literature

Patent Document 1: Japanese Unexamined Patent Application Publication No. 2011-249621 (Japanese Patent No. 5365581)
Patent Document 2: Japanese Unexamined Patent Application Publication No. 2016-114506
Patent Document 3: Japanese Unexamined Patent Application Publication No. 2017-125782
Patent Document 4: Japanese Unexamined Patent Application Publication No. 2016-504566

SUMMARY OF INVENTION

Technical Problem

However, there have been problems that if measured by the methods disclosed in Patent Documents 1 to 4, the precision of the measurement of the film thickness distribution in the microscopic area of the SOI layer of the SOI wafer is low, and there is wide variation and instability. Accordingly, the present inventor has considered various factors that affect the measurement, and has found that in the methods disclosed in Patent Documents 1 to 3, since measuring wavelengths differ according to the film thickness specifications (film thickness specs) of each SOI wafer, the precision and stability of measurement differ, and that it is necessary to consider the measuring method for the film thickness specifications of each SOI wafer, etc.

The present invention was accomplished in order to solve the above problem, and an object thereof is to provide a method for measuring a film thickness distribution of a wafer with thin films, which allows film thickness distribution measurement in the microscopic area of the thin films precisely and stably.

Solution to Problem

The present invention was accomplished in order to achieve the above object, and provides a method for measuring a film thickness distribution of a wafer with thin films, by which a film thickness distribution of a second thin film of a wafer with thin films is measured, the wafer including at least a first thin film formed on a surface of a substrate and the second thin film formed on a surface of the first thin film, the method comprising the steps of: determining a height $Z1$ of a focus using the wafer with thin films and an optical microscope with an autofocus function which uses irradiation light of wavelength $\lambda 0$ to adjust the focus; determining a wavelength $\lambda 1$ of irradiation light used for obtaining an observation image of the second thin film of the wafer with thin films; obtaining the observation image of the second thin film of the wafer with thin films using the optical microscope with the irradiation light of the wavelength $\lambda 1$, while altering heights or the focus with the $Z1$ as a reference point; calculating a standard deviation of a reflected-light intensity distribution within the observation image, obtaining a height $Z2$ of the focus corresponding to a peak position where the standard deviation of the reflected-light intensity distribution is greatest, and calculating a difference $\Delta Z$ between the $Z1$ and the $Z2$; correcting the autofocus function of the optical microscope with the $\Delta Z$ as a correction value; and using the corrected autofocus function to adjust the focus, obtaining the observation image of the second thin film of the wafer with thin films using the optical microscope, and calculating the film thickness distribution of the second thin film from the reflected-light intensity distribution within the observation image.

Such a method for measuring a film thickness distribution of a wafer with thin films allows film thickness distribution measurement in the microscopic area of the thin films precisely, stably, and simply.

Additionally, the step of determining the wavelength $\lambda 1$ comprises the steps of: calculating a profile P1 by a simulation, the profile P1 indicating a wavelength dependence of a reflectance of the wafer with thin films with respect to light of a wavelength region not less than a wavelength of visible light; calculating a profile P22 by a simulation, the profile P22 indicating a wavelength dependence of a reflectance of a reference wafer with thin films which includes a first thin film that is t [nm] thinner or thicker than a set film thickness $T1$ of the first thin film of the wafer with thin films with respect to the light of the wavelength region not less than the wavelength of visible light; calculating a profile P32 (=P22−P1) of a difference between the calculated profiles P1 and P22 and determining as $\lambda 1$ a wavelength observed when the calculated profile P32 of the difference becomes 0.

In this way, the wavelength $\lambda 1$ of the irradiation light for obtaining an image that allows calculation of the film thickness distribution of the second thin film in the irradiation area with higher spatial resolution and precision without being affected by the film thickness distribution of the first thin film can be obtained easily.

Additionally, the wafer with thin films is an SOI wafer, the first thin film is a buried oxide film layer, and the second thin film is an SOI layer composed of silicon single crystal.

When the wafer with thin films to be measured is an SOI wafer as described, the film thickness distribution of the SOI layer in the irradiation area can be calculated precisely.

Additionally, the irradiation light of the wavelength $\lambda 0$ as a longer wavelength than the wavelength $\lambda 1$, and the wavelength $\lambda 1$ is a single wavelength selected from the wavelength of visible light.

In this way, measurement can be performed simply and at low costs, since it can be performed with visible light using an ordinary optical microscope (measurement system).

Advantageous Effects of Invention

As described above, the inventive method for measuring a film thickness distribution of a wafer with thin films allows film thickness distribution measurement in the microscopic area of the thin films on the wafer with thin films accurately, stably, and simply.

BRIEF DESCRIPTION OF DRAWINGS

FIG. 1 is a flow diagram showing the steps of the inventive method for measuring the film thickness distribution of a wafer with thin films;

FIG. 2 is a schematic diagram showing an optical microscope that can be used in the inventive method for measuring the film thickness distribution of a wafer with thin films;

FIG. 3 shows the relationship between the standard deviation of the reflection intensity distribution obtained when calculating Z2 and height Z of the SOI wafer used in the Example;

FIG. 4 shows the relationship between the standard deviation of the reflection intensity distribution obtained when calculating Z2 and height Z of the SOI wafer used in the Reference Example;

FIG. 5 shows the result of the film thickness distribution (standard deviation) evaluation of the SOI layer in the Example and the Comparative Example.

DESCRIPTION OF EMBODIMENTS

Hereinafter, the present invention will be described in detail but the present invention is not limited thereto.

As stated above, a method for measuring the film thickness distribution of a wafer with thin films which allows film thickness distribution measurement in the microscopic area of the thin films precisely and stably has been required.

The present inventor has diligently investigated the above problems, and as a result, has found that a method for measuring a film thickness distribution of a wafer with thin films, by which a film thickness distribution of a second thin film of a wafer with thin films is measured, the wafer including at least a first thin film formed on a surface of a substrate and the second thin film formed on a surface of the first thin film, the method comprising the steps of: determining a height Z1 of a focus using the wafer with thin films and an optical microscope with an autofocus function which uses irradiation light of wavelength. $\lambda 0$ to adjust the focus; determining a wavelength $\lambda 1$ of irradiation light used for obtaining an observation image of the second thin film of the wafer with thin films; obtaining the observation image of the second thin film of the wafer with thin films using the optical microscope with the irradiation light of the wavelength $\lambda 1$, while altering heights of the focus with the Z1 as a reference point; calculating a standard deviation of a reflected-light intensity distribution within the observation image, obtaining a height Z2 of the focus corresponding to a peak position where the standard deviation of the reflected-iight intensity distribution is greatest, and calculating a difference $\Delta Z$ between the Z1 and the Z2; correcting the autofocus function of the optical microscope with the $\Delta Z$ as a correction value; and using the corrected autofocus function to adjust the focus, obtaining the observation image of the second thin film of the wafer with thin films using the optical microscope, and calculating the film thickness distribution of the second thin film from the reflected-light intensity distribution within the observation image allows film thickness distribution measurement in the microscopic area of the thin films on the wafer with thin films accurately and stably, and completed the present invention.

Hereinafter, the present invention will be described with reference to drawings.

In the inventive method for measuring the film thickness distribution of a wafer with thin films, an optical microscope 2 as shown in FIG. 2 can be used, for example. Irradiation light from a light source 3 of a common optical microscope 2 which has a bandpass filter 4 attached for wavelength selection can be irradiated on a partial region of the wafer with thin films 1 to be evaluated. The optical microscope 2 has an autofocus (hereinafter, also simply "AF") function, and can automatically adjust the focus. It is preferable for the irradiation light used in the AF function to have a longer wavelength than the measuring wavelength for film thickness measurement, light with a long wavelength, which has low energy and does not affect the measuring wavelength, to be used, and the wavelength to be long; 750 nm or more. In addition, the optical microscope 2 is equipped with a controller, and the controller can obtain measurement data, analyze the obtained data, control the measurement in accordance with input measuring conditions, and correct operating conditions based on input data, etc.

In addition, the wafer with thin films which is an object of the inventive method for measuring the film thickness distribution of a wafer with thin films includes at least a first thin film formed on a surface of a substrate and a second thin film formed on a surface of the first thin film. As such a wafer with thin films, it is preferable to use, for example, an SOI wafer which has a buried oxide film layer (BOX layer) corresponding to the first thin film and an SOI layer corresponding to the second thin film. In particular, when such an SOI wafer is the object of measurement, the film thickness distribution of the SOI layer can be calculated precisely.

A flow diagram of the inventive method for measuring the film thickness distribution of a wafer with thin films is shown in FIG. 1.

Firstly, as shown in S1 of FIG. 1, using an optical microscope and a wafer with thin films for evaluation, the step of determining a height Z1 of the focus is performed by adjusting a focus with an AF function which uses irradiation light of wavelength $\lambda 0$. The wafer with thin films for evaluation is the actual wafer with thin films that is to be measured.

The step shown in S2 of FIG. 1 is the step of determining a wavelength λ1 of the irradiation light used for obtaining an observation image of the second thin film of the wafer with thin films. Firstly, using the set values (specifications) of the film thicknesses of this second thin film and the first thin film, the relationship between the wavelength of the irradiation light and the reflectance of the reflected light etc. is calculated by a simulation, and from the result, the wavelength λ1 most suitable as the irradiation light for measuring is selected. As the most suitable wavelength λ1 that corresponds to the set values (specifications) of the film thicknesses of the second thin film and the first thin film, a wavelength in which there is no change in reflectance when the film thickness of the second thin film is fixed to the film thickness of the set value (specifications) and the film thickness of the first thin film is made to fluctuate is selected. By selecting the most suitable wavelength λ1 as described, reflectance fluctuation caused by film thickness fluctuation of the first thin film is eliminated, and only the influence of the film thickness fluctuation of the second thin film influences the reflectance fluctuation.

Specifically, this step can be performed as described in Patent Document 2, for example. Firstly, a profile P1 is calculated by a simulation, the profile P1 indicating a wavelength dependence of a reflectance of the wafer with thin films for evaluation with respect to light of a wavelength region not less than a wavelength of visible light. Next, calculating a profile P22 by a simulation, the profile P22 indicating a wavelength dependence of a reflectance of a reference wafer with thin films which includes a first thin film that is t [nm] thinner or thicker than a set film thickness T1 of the first thin film of the wafer with thin films for evaluation with respect to the light of the wavelength region not less than the wavelength of visible light. Next, a profile P32 (=P22−P1) of the difference between both profiles P1 and P22 calculated by a simulation is calculated and the wavelength observed when the calculated profile P32 of the difference becomes zero, that is, when the difference in reflectance becomes zero is determined as λ1.

For example, in an SOI wafer, the first thin film is equivalent to the BOX layer, and the second thin film to the SOI layer in the above description. When the film thickness specifications of the SOI wafer are SOI layer: 12 nm, BOX layer: 20 nm, it is most suitable to use 492 nm as the measuring wavelength λ1 (the most suitable wavelength is λ1), and when the film thickness specifications of the SOI wafer are SOI layer: 12 nm, BOX layer: 25 nm, it is most suitable to use 520 nm as the measuring wavelength λ1.

Incidentally, the step S2 is a simulation step, and the order with respect to the above step S1 is no object. S2 can be performed before S1, or the steps S1 and S2 can be performed at the same time, concurrently.

The step shown in S3 of FIG. 1 is the step of obtaining the observation image of the second thin film of the wafer with thin films using the optical microscope with the irradiation light of the wavelength λ1 determined in S2, while altering heights of the focus with the Z1 obtained in S1 as a reference point. The pitch of the position of the focus height for obtaining the observation image is preferably 0.5 μm or less and more preferably, 0.2 μm or less. In such a range, the measurement can be performed with higher precision.

The step shown in S4 of FIG. 1 is the step of calculating a standard deviation of a reflected-light intensity distribution within the observation image of the second thin film obtained in S3, obtaining a height Z2 of the focus corresponding to a peak position where the standard deviation of the reflected-light intensity distribution is greatest, and calculating a difference ΔZ between the Z1 and the Z2 (=Z1−Z2). ΔZ may be calculated by inputting Z2 into the controller of the optical microscope and calculating ΔZ (=Z1−Z2) within the controller. The position Z2 at which the standard deviation of the reflected-light intensity distribution of the observation image of the second thin film obtained in S3 is greatest can be considered as the focal position when irradiation light with the wavelength λ1 is used. Using this Z2, ΔZ=Z1−Z2 can be obtained. As described, ΔZ is the difference between the focal position Z1 obtained by the AF function which uses irradiation light of wavelength λ0 and the focal position Z2 when irradiation light of wavelength λ1, used when obtaining the observation image of the second thin film, is used, and becomes the correction value used in the correction of the AF function in the next step (S5).

The step shown in S5 of FIG. 1 is the step of correcting the AF function of the optical microscope with the ΔZ determined in S4 as a correction value. The calculated ΔZ may be input into the controller of the optical microscope as the correction value, or the ΔZ obtained by calculating within the controller from the input Z2 may be loaded as the correction value.

The step shown in S6 of FIG. 1 is the step of using the corrected AF function to adjust the focus, obtaining the observation image of the second thin film of the wafer with thin films using the optical microscope, and calculating the film thickness distribution of the second thin film from the reflected-light intensity distribution within the observation image. By using the corrected AF function, the focal position obtained by operating the AF function is corrected by the correction value ΔZ, and therefore, the observation image of the second thin film is obtained with the high-precision focal position when the irradiation light of wavelength λ1 is used. By determining the film thickness distribution based on the reflection intensity distribution of the observation image thus obtained, film thickness distribution can be evaluated with high precision. Evaluation of the film thickness distribution is preferably performed with the standard deviation of the film thickness distribution, for example.

EXAMPLE

Hereinafter, the present invention will be described in detail with reference to Examples, but the present invention is not limited thereto.

The optical microscope which is Che film thickness measurement system used in the Example, the Reference Example, and the Comparative Example has an AF function and can obtain an observation image (microscope image). The wavelength of the irradiation light used in the AF function is 785 nm. In addition, the adjustment and selection of the wavelength of the irradiation light for obtaining an observation image are performed using a bandpass filter.

Example

An SOI wafer with film thickness specifications of SOI layer: 12 nm, BOX layer: 20 nm was used. Firstly, this SOI wafer was set into the optical microscope (film thickness measurement system), the focus was adjusted using the AF function, and the focal position Z1 was determined. The Z1 was obtained automatically.

In addition, the wavelength λ1 of the irradiation light to be used for obtaining the observation image of the SOI layer of this SOI wafer was determined by a simulation, and the measuring wavelength λ1 was 492 nm.

Next, the wavelength of the irradiation light for obtaining the observation image was adjusted using a bandpass filter and the wavelength of the irradiation light was set to λ1=492 nm. Subsequently, changing the height of the focus up and down with the Z1 as the reference point, the observation image was obtained, and the relationship between the standard deviation of the reflection intensity distribution of the obtained observation image and height Z was determined. The relationship between the height Z and the standard deviation of the reflection intensity distribution is shown in FIG. 3. The height at which the standard deviation is at the peak value as shown in FIG. 3 is Z2. Incidentally, in FIG. 3 and FIG. 4, described below, Z1 is positioned outside the range of the graph to the right (outside the range of the horizontal axis).

The Z2, thus obtained, was input into the optical microscope and the correction value ΔZ (=Z1−Z2) was calculated in the controller within the optical microscope, and at this time, the AF function was corrected using this correction value ΔZ.

Subsequently, the focal position obtained by AF was corrected by the correction value ΔZ, the observation image of the SOI layer of the SOI wafer was obtained, and the standard deviation of the film thickness distribution was calculated from the reflected-light intensity distribution within the observation image of the measuring area. Specifically, the standard deviation of the film thickness distribution of the SOI layer was calculated on five points of the wafer surface (one point in the center+four points positioned 5 mm inwards from the outer peripheral edge) on the basis of the reflected-light intensity distribution within the observation image. Incidentally, the measuring area is 266 μm×266 μm (2048×2048 pixels).

Reference Example

An SOI wafer with film thickness specifications of SOI layer: 12 nm, BOX layer: 25 nm was used. The wavelength λ1 of the irradiation light used for obtaining the observation image of the SOI layer of this SOI wafer was 520 nm. The relationship between the height Z of the observation image and the standard deviation of the reflection intensity distribution obtained in the same way as in the Example was determined, and the relationship as shown in FIG. 4 was obtained. It can be seen from this result that, if the thickness of the BOX layer is different, λ1 is different, and as a result, the correction value, which depends on the peak position Z2 of the focus, is also different.

Comparative Example

Apart from adopting the conventional method for measuring film thickness distribution described below, the same SOI wafer as in the Example was used, and the film thickness distribution was measured. The specific procedure was as follows.

(1) Using a sample wafer with a pattern, the height Z1 of the focus is determined using the AF function of an optical microscope which is a film thickness measurement system.

(2) Using a filter for obtaining a measuring wavelength λ1 in that position, an irradiation light with the wavelength λ1 is irradiated, the focus is visually adjusted onto the pattern of the microscope image, and the height Z2 of the position where the pattern comes into focus is determined.

(3) The Z2 is input into the optical microscope and the correction value ΔZ (=Z1−Z2) is calculated in the controller within the optical microscope, and at this time, the AF function is corrected using this correction value ΔZ.

(4) While measuring the film thickness distribution, the focal position adjusted by the AF function is corrected by ΔZ, an observation image is obtained, and from the reflection intensity distribution thereof, the standard deviation of the film thickness distribution is determined.

Evaluation of the film thickness distribution measurement in the Example and the Comparative Example was performed as follows. Firstly, by the measuring method of the Comparative Example, measurement at the frequency of three times a day was repeated for 31 days. After that, the measuring method was switched over to that of the Example, and measurement was repeated for a further 42 days.

The evaluation results are shown in FIG. 5. The number of each plot shows the measured position as shown in the conceptual diagram of the wafer in the figure. Incidentally, the order of measurement goes from the right towards the left of the horizontal axis in FIG. 5. As shown in FIG. 5, it can be seen that the standard deviation of the film thickness distribution of the SOI layer measured by the inventive measuring method in the Example had a decreased variation between measurements and stable measurement results were obtained, compared to the Comparative Example in which a conventional measuring method was used.

Incidentally, the value of the standard deviation of the film thickness distribution of the SOI layer in the Example is large, compared to the Comparative Example, and this means, accurate adjustment of the focus of the measuring wavelength has made repeatable and accurate measurement of film thickness distribution possible. This is a similar phenomenon to the following. When the surface roughness (RMS) of a predetermined area is measured by an AFM (atomic force microscope), if a probe with a rounded tip is changed to a probe with a sharp tip and the surface roughness (RMS) of the same area is measured, the surface roughness (RMS) is more accurately measured, and as a result, the value of the surface roughness (RMS) becomes larger.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A method for measuring a film thickness distribution of a wafer with thin films, by which a film thickness distribution of a second thin film of a wafer with thin films is measured, the wafer including at least a first thin film formed on a surface of a substrate and the second thin film formed on a surface of the first thin film, the method comprising the steps of:

determining a height Z1 of a focus using the wafer with thin films and an optical microscope with an autofocus function which uses irradiation light of wavelength λ0 to adjust the focus;

determining a wavelength $\lambda 1$ of irradiation light used for obtaining an observation image of the second thin film of the wafer with thin films;

obtaining the observation image of the second thin film of the wafer with thin films using the optical microscope with the irradiation light of the wavelength $\lambda 1$, while altering heights of the focus with the Z1 as a reference point;

calculating a standard deviation of a reflected-light intensity distribution within the observation image, obtaining a height Z2 of the focus corresponding to a peak position where the standard deviation of the reflected-light intensity distribution is greatest, and calculating a difference $\Delta Z$ between the Z1 and the Z2;

correcting the autofocus function of the optical microscope with the $\Delta Z$ as a correction value; and using the corrected autofocus function to adjust the focus, obtaining the observation image of the second thin film of the wafer with thin films using the optical microscope, and calculating the film thickness distribution of the second thin film from the reflected-light intensity distribution within the observation image.

2. The method for measuring a film thickness distribution of a wafer with thin films according to claim 1, wherein the step of determining the wavelength $\lambda 1$ comprises the steps of:

calculating a profile P1 by a simulation, the profile P1 indicating a wavelength dependence of a reflectance of the wafer with thin films with respect to light of a wavelength region not less than a wavelength of visible light;

calculating a profile P22 by a simulation, the profile P22 indicating a wavelength dependence of a reflectance of a reference wafer with thin films which includes a first thin film that is t thinner or thicker than a set film thickness T1 of the first thin film of the wafer with thin films with respect to the light of the wavelength region not less than the wavelength of visible light;

calculating a profile P32 (=P22−P1) of a difference between the calculated profiles P1 and P22 and determining as $\lambda 1$ a wavelength observed when the calculated profile P32 of the difference becomes 0.

3. The method for measuring a film thickness distribution of a wafer with thin films according to claim 2, wherein the wafer with thin films is an SOI wafer, the first thin film is a buried oxide film layer, and the second thin film is an SOI layer composed of silicon single crystal.

4. The method for measuring a film thickness distribution of a wafer with thin films according to claim 3, wherein the irradiation light of the wavelength $\lambda 0$ has a longer wavelength than the wavelength $\lambda 1$, and the wavelength $\lambda 1$ is a single wavelength selected from the wavelength of visible light.

5. The method for measuring a film thickness distribution of a wafer with thin films according to claim 2, wherein the irradiation light of the wavelength $\lambda 0$ has a longer wavelength than the wavelength $\lambda 1$, and the wavelength $\lambda 1$ is a single wavelength selected from the wavelength of visible light.

6. The method for measuring a film thickness distribution of a wafer with thin films according to claim 1, wherein the wafer with thin films is an SOI wafer, the first thin film is a buried oxide film layer, and the second thin film is an SOI layer composed of silicon single crystal.

7. The method for measuring a film thickness distribution of a wafer with thin films according to claim 6, wherein the irradiation light of the wavelength $\lambda 0$ has a longer wavelength than the wavelength $\lambda 1$, and the wavelength $\lambda 1$ is a single wavelength selected from the wavelength of visible light.

8. The method for measuring a film thickness distribution of a wafer with thin films according to claim 1, wherein the irradiation light of the wavelength $\lambda 0$ has a longer wavelength than the wavelength $\lambda 1$, and the wavelength $\lambda 1$ is a single wavelength selected from the wavelength of visible light.

* * * * *